United States Patent [19]
Sugiyama et al.

[11] Patent Number: 6,075,253
[45] Date of Patent: Jun. 13, 2000

[54] MONOCRYSTALLINE SEMICONDUCTOR PHOTODETECTOR

[75] Inventors: Mitsuhiro Sugiyama; Toru Tatsumi, both of Tokyo, Japan

[73] Assignee: NEC Corporation, Tokyo, Japan

[21] Appl. No.: 09/060,256

[22] Filed: Apr. 15, 1998

[30] Foreign Application Priority Data

Apr. 15, 1997 [JP] Japan ................................. 9-097533

[51] Int. Cl.⁷ ................................................. H01L 29/06
[52] U.S. Cl. ................................. 257/19; 257/21; 257/22; 257/458; 257/461; 257/466; 257/616
[58] Field of Search ............................. 257/19, 21, 22, 257/189, 190, 458, 461, 466, 616

[56] References Cited

U.S. PATENT DOCUMENTS 5,576,221  11/1996  Takemura et al. .
5,796,118   8/1998  Morikawa et al. ..................... 257/466

FOREIGN PATENT DOCUMENTS 61-500466   3/1986  Japan .
5-327001   12/1993  Japan .
7-231113    8/1995  Japan .
8-316449   11/1996  Japan .

OTHER PUBLICATIONS

M. Sugiyama et al., "A selective epitaxial SiGe/Si planar photodetector for Si-based OEIC'S", *IEDM 95*, 1995, pp. 583–586.

B. Jalai et al., "Si–Based Receivers for Optical Data Links", *Journal of Lightwave Technology*, vol. 12, No. 6, Jun., 1994, pp. 930–934.

*Primary Examiner*—Minh Loan Tran
*Attorney, Agent, or Firm*—Sughrue, Mion, Zinn, Macpeak & Seas, PLLC

[57] ABSTRACT

A semiconductor photodetector having a planar structure, including a first silicon layer having a first conductivity and formed with a recess, a silicon dioxide film covering a sidewall of the recess therewith, a germanium monocrystal layer formed in the recess, a first germanium layer having a first conductivity and sandwiched between the germanium monocrystal layer and the first silicon layer in the recess, a second germanium layer having a second conductivity and formed on the germanium monocrystal layer, and a second silicon layer having a second conductivity and formed on the second germanium layer. The first and second germanium layers prevent a depletion layer, which are generated in the germanium monocrystal layer when a voltage is applied to the semiconductor photodetector, from reaching the first and second silicon layers, respectively. In accordance with the semiconductor photodetector, a depletion layer generated in the germanium monocrystal layer is prevented from reaching the first and second silicon layers, and hence, electric charges generated by introduction of light into the germanium monocrystal layer would not be recombined to each other through a recombination core. As a result, it is possible to avoid reduction in a photoelectric current or a quantum efficiency.

18 Claims, 5 Drawing Sheets

MONOCRYSTALLINE SEMICONDUCTOR PHOTODETECTOR

BACKGROUND OF THE INVENTION

1. Field of the Invention

The invention relates to a semiconductor photodetector, and more particularly to a photodetector including a photo-absorption layer composed of germanium and formed in a silicon substrate.

2. Description of the Related Art

A photodiode used as a semiconductor photodetector for communication has a photo-absorption layer which may be composed of different materials in dependence on a wavelength of received lights in order to ensure a required light-receiving sensitivity. A photo-absorption layer composed of material having a smaller bandgap generally has a higher light-receiving sensitivity in a long wavelength region. Hence, for instance, a photo-absorption layer is composed of silicon (Si) for receiving a light having a wavelength of 1.0 µm or smaller, or a photo-absorption layer is composed of germanium (Ge) or indium gallium arsenide (InGaAs) for receiving a light having a wavelength in a so-called long wavelength band, specifically, a wavelength of 1.0 µm or greater.

Materials of which a photo-absorption layer is composed for receiving a light having a wavelength belonging to a long wavelength band are generally expensive relative to silicon, and need higher fabrication costs than silicon, both of which are accompanied with a problem that a resultant photodiode is expensive.

Thus, there has been a need of a photodiode which can be fabricated in silicon process which can be carried out at relatively low costs, and which has an adequate light-receiving sensitivity for a light having a wavelength in a long wavelength band. To this end, a material having an adequate light-receiving sensitivity for a light having a wavelength in a long wavelength band, such as germanium, may be deposited directly onto a silicon substrate. However, such a material generally has a lattice constant different from that of silicon, resulting in that germanium is difficult to grow in crystal on a silicon substrate.

As a solution to this problem, there has been suggested a photodiode by B. Jalali et al. in "Si-Based Receivers for Optical Data Links", Journal of Lightwave Technology, Vol. 12, No. 6, June 1994, pp. 930–934. FIG. 1 illustrates the suggested photodiode. The illustrated photodiode is in the mesa-form, and includes a silicon substrate 20, a silicon monocrystal layer 21, a photo-absorption layer 14, a silicon monocrystal layer 21, and a p-type silicon layer 10, the layers 21, 14, 21, 10 being deposited on the silicon substrate 20 in this order. The photo-absorption layer 14 is comprised of alternately deposited silicon (Si) layers and silicon germanium (SiGe) layers.

The mixture of silicon and germanium gives the photo-absorption layer 14 a smaller bandgap than that of silicon, and as a result, the photodiode can have a higher light-receiving sensitivity to a light having a wavelength in a long wavelength band. However, since silicon germanium has a different lattice constant from that of silicon, it is impossible to deposit a thick silicon germanium layer on a silicon substrate with the crystal structure being kept in good condition. Accordingly, silicon layers and silicon germanium layers are alternately deposited to thereby cause the silicon germanium layer to have a greater thickness.

The inventors have newly developed the SiGe photodiode, and suggested it in Japanese Unexamined Patent Publication No. 7-231113. The suggested photodiode is not of mesa type, but of planar type in which Si/SiGe layers are embedded in a silicon substrate. In addition, an experimental product has been published in 1995 IEDM Technical Digest, pp. 583–586.

FIG. 2 is a cross-sectional view of the planar type SiGe photodiode suggested by the inventors in Japanese Unexamined Patent Publication No. 7-231113. The illustrated photodiode is comprised of a silicon substrate 1, a silicon dioxide film 19 formed on the silicon substrate 1, an n-type buried layer 2 formed on the silicon dioxide film 19, an n-type epitaxial layer 3 formed on the n-type buried layer 2 and formed with a recess, a silicon dioxide film 6 covering a sidewall of the recess therewith, a Si/SiGe photo-absorption layer 14 formed in the recess, a p-type silicon layer 10 formed on the Si/SiGe photo-absorption layer 14, and a silicon dioxide film 5 formed on the n-type epitaxial layer 3. In this photodiode, a planar structure is accomplished by forming the Si/SiGe photo-absorption layer 14 in the recess by selective epitaxial growth with the silicon dioxide film 5 being used as a mask.

Since the photodiode illustrated in FIG. 2 has a planar structure, a silicon transistor integrated circuit and a photodiode can be readily formed on a common silicon substrate, which ensures readily fabricating of Si-OEIC (Opto-Electric Integrated Circuits) suitable for receiving a light having a wavelength in a long wavelength band.

As an example of a photodiode including a germanium crystal layer deposited on a silicon substrate, Japanese Unexamined Patent Publication No. 61-500466, which is based on PCT/US84/01611 filed on Oct. 10, 1984, has suggested a photodiode in which an intermediate region is formed between a silicon layer and a germanium layer, and a photo-absorption layer composed of germanium is formed on a silicon substrate.

FIG. 3 illustrates the suggested photodiode, which is comprised of a silicon substrate 18, a Si/Ge layer 15, an n-type germanium layer 7, a germanium monocrystal layer 8, and a p-type germanium layer 9, the layers 15, 7, 8, 9 being deposited on the silicon substrate 18 in this order. In this photodiode, the SiGe layer 15 as an intermediate region is designed to contain germanium in a concentration gradually increasing towards the silicon substrate 18 so that the SiGe layer 15 contains germanium at 100% at an end thereof similarly to a photo-absorption layer.

Accordingly, in spite of a difference in a lattice constant between silicon and silicon germanium, a germanium monocrystal layer (not illustrated) can be formed on the SiGe layer 15 by crystal growth. Since the germanium concentration gradually varies in the SiGe layer 15, the SiGe layer 15 can perform crystal-growth thereof.

However, the photodiode illustrated in FIG. 3 is accompanied with a problem as follows. As mentioned earlier, the SiGe layer 15 as an intermediate region contains germanium. Hence, for instance, if the photodiode received a light having a wavelength of 1.3 µm band, the SiGe layer 15 absorbs a light to some degree, and as a result, there are generated some electric charges.

However, the intermediate region 15 contains impurities therein, and hence, a depletion layer is not spread therein. In a photodiode having a PN junction, whereas electric charges in a depletion layer move by drift, electric charges generated outside the depletion layer move to an end of the depletion layer by diffusion which gives lower mobility to electric charges than drift, and then, turn into a photoelectric current. As a result, a frequency band of the photodiode is considerably deteriorated. Accordingly, the intermediate region 15 containing germanium therein is a source of generating unnecessary electric charges which would deteriorate a frequency characteristic of the photodiode, and hence, is a hindrance to enhancement in photodiode performances.

SUMMARY OF THE INVENTION

In view of the foregoing problems in the conventional semiconductor photodetectors, it is an object of the present invention to provide a photodetector having improved high frequency characteristics and quantum efficiency. It is also an object of the present invention to provide a method of fabricating the same.

In one aspect of the present invention, there is provided a semiconductor photodetector having a planar structure, including (a) a first semiconductor layer having a first conductivity and formed with a recess, (b) an insulating film covering a sidewall of the recess therewith, (c) a photo-absorption layer formed in the recess, and (d) a first layer sandwiched between the photo-absorption layer and the first semiconductor layer in the recess, the first layer preventing a depletion layer generated in the photo-absorption layer when a voltage is applied to the semiconductor photodetector, from reaching the first semiconductor layer.

There is further provided a semiconductor photodetector having a planar structure, including (a) a first semiconductor layer having a first conductivity and formed with a recess, (b) an insulating film covering a sidewall of the recess therewith, (c) a photo-absorption layer formed in the recess, (d) a first layer sandwiched between the photo-absorption layer and the first semiconductor layer in the recess, (e) a second layer formed on the photo-absorption layer, and (f) a second semiconductor layer having a second conductivity and formed on the second layer, the first and second layers preventing a depletion layer generated in the photo-absorption layer when a voltage is applied to the semiconductor photodetector, from reaching the first and second semiconductor layers, respectively.

It is preferable that the first and/or second semiconductor layers are silicon layers, and the insulating film is a silicon dioxide film.

There is still further provided a semiconductor photodetector having a planar structure, including (a) a first semiconductor layer having a first conductivity and formed with a recess, (b) an insulating film covering a sidewall of the recess therewith, (c) a germanium monocrystal layer formed in the recess, and (d) a first layer sandwiched between the germanium monocrystal layer and the first semiconductor layer in the recess, the first layer preventing a depletion layer generated in the germanium monocrystal layer when a voltage is applied to the semiconductor photodetector, from reaching the first semiconductor layer.

It is preferable that the first layer is a germanium layer or a gallium arsenide layer. It is also preferable that the first layer contains impurities at about $1 \times 10^{18}$ cm$^{-3}$.

There is yet further provided a semiconductor photodetector having a planar structure, including (a) a first semiconductor layer having a first conductivity and formed with a recess, (b) an insulating film covering a sidewall of the recess therewith, (c) a germanium monocrystal layer formed in the recess, (d) a first layer sandwiched between the germanium monocrystal layer and the first semiconductor layer in the recess, (e) a second layer formed on the germanium monocrystal layer, and (f) a second semiconductor layer having a second conductivity and formed on the second layer, the first and second layers preventing a deple-tion layer generated in the germanium monocrystal layer when a voltage is applied to the semiconductor photodetector, from reaching the first and second semiconductor layers, respectively.

It is preferable that the first and second semiconductor layers are silicon layers, and the insulating film is a silicon dioxide film.

For instance, the first layer may be one of a germanium layer having a first conductivity and a germanium layer having a second conductivity, and the second layer may be the other. The first and second layers preferably contain impurities at about $1 \times 10^{18}$ cm$^{-3}$.

When the second layer is a germanium layer having a second conductivity, and the semiconductor layer is a silicon layer, it is preferable that the semiconductor photodetector further includes a silicon layer having a second conductivity and formed on the second layer.

The first layer may be one of a germanium layer having a first conductivity and a gallium arsenide layer having a second conductivity, and the second layer may be the other.

When the second layer is a gallium arsenide layer having a second conductivity, and the semiconductor layer is a silicon layer, it is preferable that the semiconductor photodetector further includes a silicon layer having a second conductivity and formed on the second layer.

In another aspect of the present invention, there is provided a method of fabricating a semiconductor photodetector including the steps of (a) forming an epitaxial layer on a semiconductor substrate, (b) forming a recess throughout the epitaxial layer, (c) forming an insulating film on a sidewall of the recess, (d) forming a first layer on a bottom of the recess, and (e) forming a photo-absorption layer on the first layer. The first layer is designed to prevent a depletion layer generated in the photo-absorption layer when a voltage is applied to the semiconductor photodetector, from reaching the first semiconductor layer.

For instance, the photo-absorption layer is a germanium monocrystal layer. The first layer may be a germanium layer or a gallium arsenide layer. The first layer preferably contains impurities at about $1 \times 10^{18}$ cm$^{-3}$.

There is further provided a method of fabricating a semiconductor photodetector including the steps of (a) forming a first semiconductor layer on a semiconductor substrate, (b) forming a recess throughout the first semiconductor layer, (c) forming an insulating film on a sidewall of the recess, (d) forming a first layer on a bottom of the recess, (e) forming a photo-absorption layer on the first layer, (f) forming a second layer on the photo-absorption layer, and (g) forming a second semiconductor layer on the second layer. The first and second layers are designed to prevent a depletion layer generated in the photo-absorption layer when a voltage is applied to the semiconductor photodetector, from reaching the first and second semiconductor layers, respectively.

For instance, the first layer may be one of a germanium layer having a first conductivity and a germanium layer having a second conductivity, and the second layer may be the other. The first and second layers preferably contain impurities at about $1 \times 10^{18}$ cm$^{-3}$. When the second layer is a germanium layer having a second conductivity, and the semiconductor layer is a silicon layer, it is preferable that the method further includes the step of forming a silicon layer having a second conductivity on the second layer.

The first layer may be one of a germanium layer having a first conductivity and a gallium arsenide layer having a second conductivity, and the second layer may be the other. When the second layer is a gallium arsenide layer having a second conductivity, and the semiconductor layer is a silicon layer, it is preferable that the method further includes the step of forming a silicon layer having a second conductivity on the second layer.

In accordance with the above-mentioned invention, a depletion layer in a photo-absorption layer composed of, for instance, germanium is not allowed to reach an interface between the photo-absorption layer and the semiconductor substrate. Hence, electric charges generated when a light is introduced into the photodetector would not be recombined with each other through a recombination core in the interface. As a result, it is possible to avoid reduction in a photoelectric current and hence a quantum efficiency.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
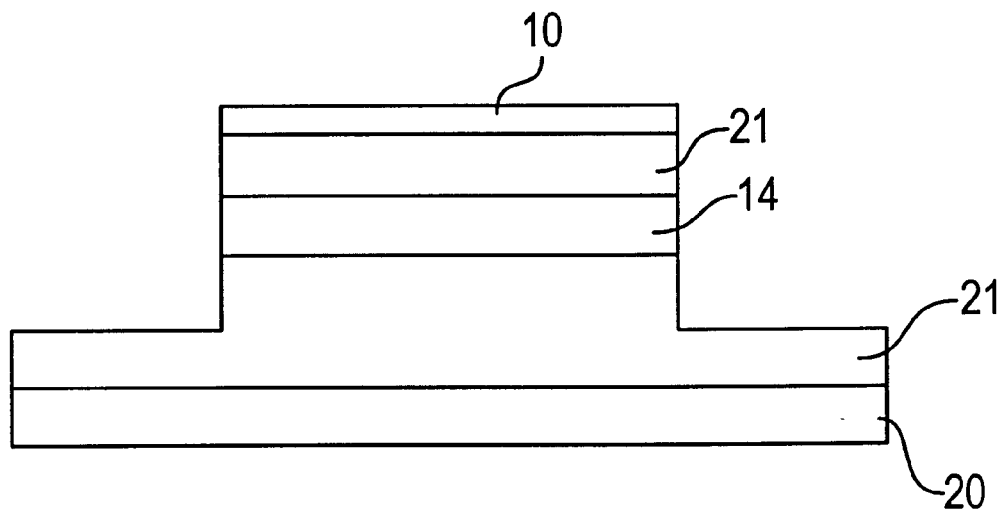
FIG. 1 is a cross-sectional view of a conventional photodetector.
Figure 2:
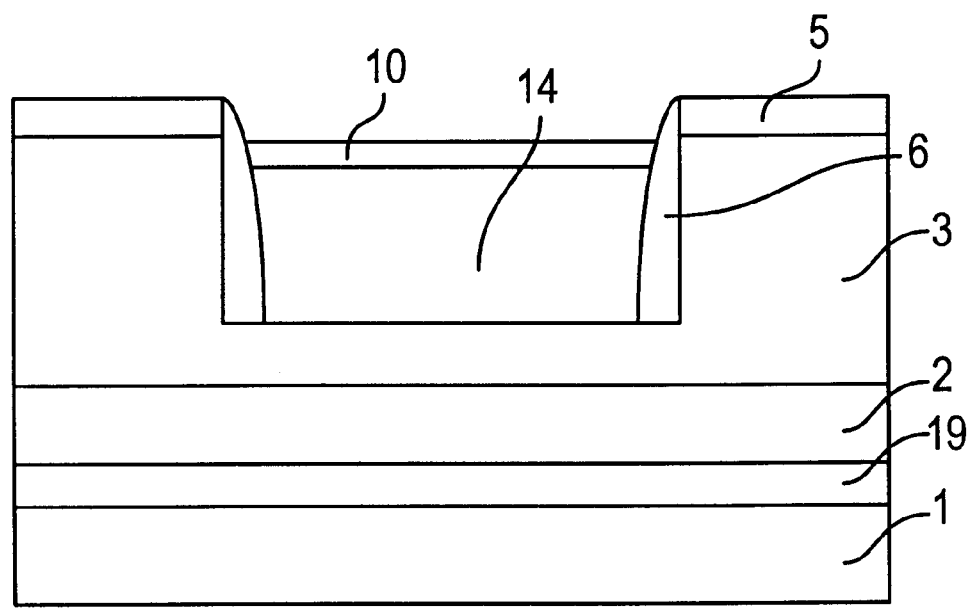
FIG. 2 is a cross-sectional view of another conventional photodetector.
Figure 3:
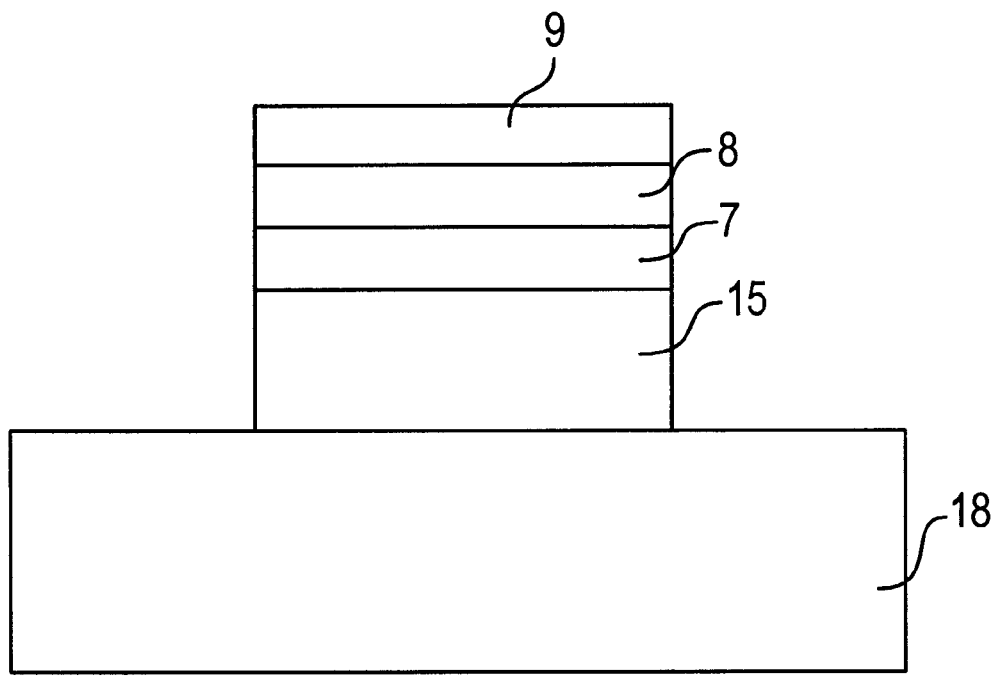
FIG. 3 is a cross-sectional view of still another conventional photodetector.
Figure 4:
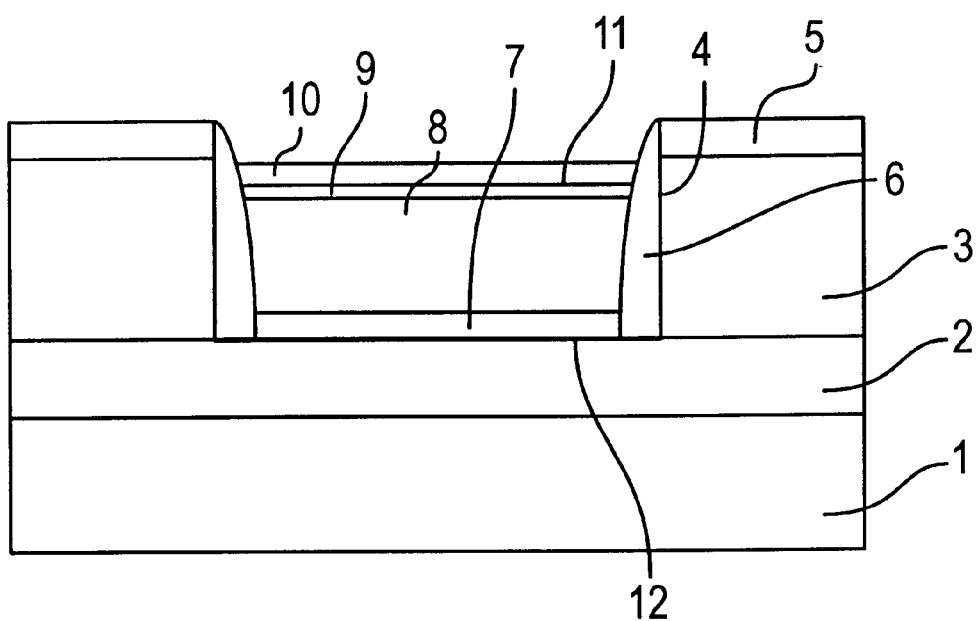
FIG. 4 is a cross-sectional view of a photodetector in accordance with the first embodiment of the present invention.

FIG. 4 is a cross-sectional view of a semiconductor photodetector in accordance with the first embodiment of the present invention.

The illustrated photodetector is comprised of a p-type silicon substrate 1, an n-type buried layer 2 formed in the p-type silicon substrate 1, an n-type epitaxial layer 3 formed on the n-type buried layer 2 and formed with a recess 4, a silicon dioxide film 6 covering a sidewall of the recess 4 therewith, an n-type germanium layer 7 formed on the n-type buried layer 2 at a bottom of the recess 4, a photo-absorption layer 8 formed on the n-type germanium layer 7 in the recess 4, a p-type germanium layer 9 formed on the photo-absorption layer 8, a p-type silicon layer 10 formed on the p-type germanium layer 9, and a silicon dioxide film 5 formed on the n-type epitaxial layer 3.

The illustrated photodetector is of a planar structure constituting of a photodiode structure having a PN junction. The photo-absorption layer 8 is buried in the recess 4 with the germanium layers 7 and 9 sandwiching the photo-absorption layer 8 therebetween. The germanium layers 7 and 9 sandwiching the photo-absorption layer 8 therebetween are designed to prevent a depletion layer generated in the photo-absorption layer 8 when a voltage is applied to the semiconductor photodetector for operation thereof, from reaching both an interface 11 between the p-type germanium layer 9 and the p-type silicon layer 10 and an interface 12 between the n-type germanium layer 7 and the n-type buried layer 2.

In the photodetector illustrated in FIG. 4 in accordance with the first embodiment, the photo-absorption layer 8 is composed of germanium monocrystal, and the germanium monocrystal layer 8 is covered at a lower surface thereof with the germanium layer 7 having a first conductivity, namely, n-type conductivity, and is covered at an upper surface thereof with the germanium layer 9 having a second conductivity, namely, p-type conductivity. On the germanium layer 9 is formed the silicon layer 10 having the same conductivity as that of the germanium layer 9.

Since the germanium monocrystal layer 8 is sandwiched between the n-type germanium layer 7 and the p-type germanium layer 9, a depletion layer, which is generated in the photo-absorption layer 8 when a voltage is applied to the semiconductor photodetector for operation thereof, is not allowed to reach both the interfaces 11 and 12. Accordingly, it is possible to avoid electric charges generated in the depletion layer from being recombined with each other through a recombination core in the interfaces 11 and 12, resulting in that reduction in a photoelectric current and hence a quantum efficiency can be avoided.

The n- and p-type germanium layers 7 and 9 sufficiently contain impurities at about $1 \times 10^{18}$ cm$^{-3}$. If a lower voltage was applied to the photodetector, the n- and p-type germanium layers 7 and 9 may contain impurities at a lower concentration.

With reference to FIGS. 5A to 5E, a method of fabricating the above-mentioned photodetector is explained hereinbelow.

Figure 5A:
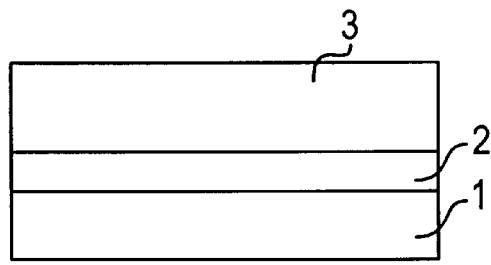
FIGS. 5A to 5E are cross-sectional views of a photodetector, illustrating respective steps of a method of fabricating the photodetector illustrated in FIG. 4.

First, as illustrated in FIG. 5A, an n-type buried layer 2 is formed at a surface of a p-type silicon substrate 1. Then, an n-type epitaxial layer 3 is formed on the silicon substrate 1.

Figure 5B:
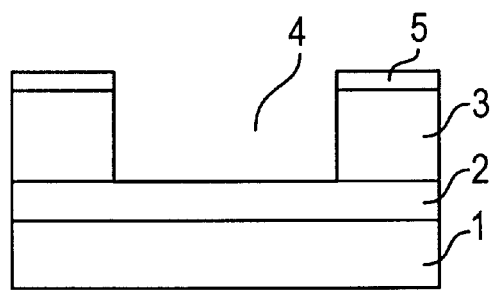

Then, a silicon dioxide film 5 is formed on the n-type epitaxial layer 3, and patterned into a desired pattern. Then, as illustrated in FIG. 5B, the n-type epitaxial layer 3 is dry etched through the use of chlorine gas with the patterned silicon dioxide film 5 being used as a mask, to thereby form a recess 4 throughout the n-type epitaxial layer 3. The thus formed recess 4 has a depth of about 1 $\mu$m.

Figure 5C:
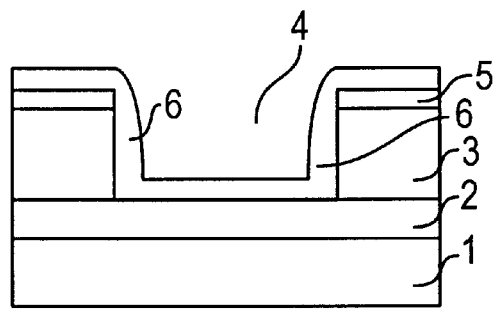
Figure 5D:
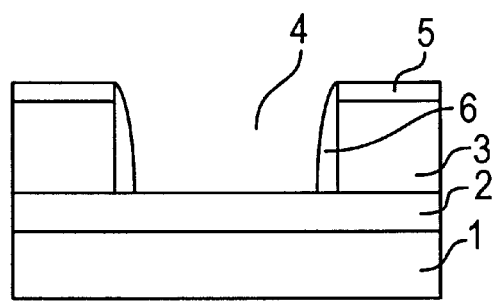

Then, as illustrated in FIG. 5C, a silicon dioxide film 6 is deposited entirely over the product. Then, the silicon dioxide film 6 is etched back in such a manner that the silicon dioxide film 6 remains non-removed only on an inner sidewall of the recess 4, as illustrated in FIG. 5D.

Figure 5E:
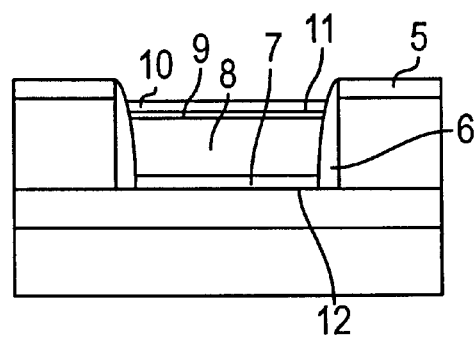

Then, as illustrated in FIG. 5E, there are formed an n-type germanium layer 7 by a thickness of 0.1 $\mu$m, a germanium monocrystal layer 8 by a thickness of 0.6 $\mu$m, a p-type germanium layer 9 by a thickness of 0.1 $\mu$m, and a p-type silicon layer 10 by a thickness of 0.2 $\mu$m in the recess 4 at about 350 degrees centigrade by epitaxial growth with the silicon dioxide films 5 and 6 being used as a mask. The layers 7, 8, 9 are formed through the use of germane (GeH$_4$) gas, and the layer 10 is formed through the use of disilane (Si$_2$H$_6$) gas. The epitaxial growth for forming these layers 7–10 can be accomplished by the method suggested by the inventors in (not published yet) in which a germanium layer is grown directly onto a silicon substrate. Herein, Japanese Patent Application No. 9-70933 is hereby incorporated by reference to extent that it is consistent herewith. A silicon layer can be grown on a germanium layer in a similar manner as that of the method suggested in the above-mentioned Application.

The germanium monocrystal layer 8 is so-called an i-layer which is a layer containing no impurities therein. When a voltage is applied to the photodetector, a depletion layer spreads out in the germanium monocrystal layer 8.

In the method illustrated in FIGS. 5A to 5E, the n- and p-type germanium layers 7 and 9 are concurrently grown. By adding phosphine ($PH_3$) and diborane (BH) gases as a growth gas into the n- and p-type germanium layers 7 and 9, respectively, crystal containing phosphorus and boron therein can be grown. As mentioned earlier, the n- and p-type germanium layers 7 and 9 sufficiently contain impurities at about $1 \times 10^{18}$ $cm^{-3}$. An accuracy about a concentration of the impurities to be contained in the germanium layers 7 and 9 is not highly required.

An impurity diffusion coefficient in germanium is higher than an impurity diffusion coefficient in silicon by three to five figures or greater. Hence, if impurities implanted into the n- and p-type germanium layers 7 and 9 were diffused into the germanium monocrystal layer 8, the germanium monocrystal layer 8 or i-layer as a photo-absorption layer would have a smaller width. For instance, phosphorus and boron have a high impurity diffusion coefficient in germanium, specifically, $2.4 \times 10^{-11}$ $cm^2/s$ and $4 \times 10^{-12}$ $cm^2/s$ at 850 degrees centigrade, respectively. Hence, taking the diffusion of impurities into consideration, it is preferable that the germanium monocrystal layer 8 is designed to have a slightly greater thickness.

In accordance with the first embodiment, if a bias voltage of about 10 V, for instance, is applied to the photodetector, a depletion layer spreads out only in the germanium monocrystal layer 8, and is not allowed to reach both the interface 11 between the p-type germanium layer 9 and the p-type silicon layer 10 and the interface 12 between the n-type germanium layer 7 and the n-type buried layer 2. Since no recombination cores exist in the depletion layer, a quantum efficiency is not reduced unlike the conventional photodetectors.

Hereinbelow is explained a photodetector in accordance with the second embodiment of the present invention, with reference to FIG. 6.

The illustrated photodetector is comprised of a p-type silicon substrate 1, an n-type buried layer 2 formed in the p-type silicon substrate 1, an n-type epitaxial layer 3 formed on the n-type buried layer 2 and formed with a recess 4, a silicon dioxide film 6 covering a sidewall of the recess 4 therewith, an n-type germanium layer 7 formed on the n-type buried layer 2 at a bottom of the recess 4, a photo-absorption layer 8 formed on the n-type germanium layer 7 in the recess 4, a p-type gallium arsenide (GaAs) layer 13 formed on the photo-absorption layer 8, a p-type silicon layer 10 formed on the p-type gallium arsenide layer 13, and a silicon dioxide film 5 formed on the n-type epitaxial layer 3.

The illustrated photodetector is of a planar structure constituting of a photodiode structure having a PN junction. The photo-absorption layer 8 is buried in the recess 4 with the germanium layer 7 and the gallium arsenide layer 13 sandwiching the photo-absorption layer 8 therebetween. The layers 7 and 13 are designed to prevent a depletion layer generated in the photo-absorption layer 8 when a voltage is applied to the semiconductor photodetector for operation thereof, from reaching both an interface 11 between the gallium arsenide layer 13 and the p-type silicon layer 10 and an interface 12 between the n-type germanium layer 7 and the n-type buried layer 2.

That is, in the second embodiment, the p-type gallium arsenide (GaAs) layer 13 is substituted for the p-type germanium layer 9 in the first embodiment.

Figure 6:
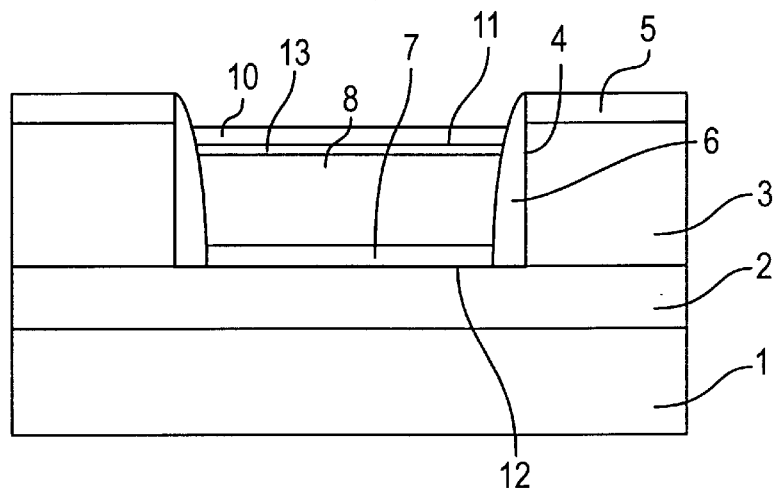
FIG. 6 is a cross-sectional view of a photodetector in accordance with the second embodiment of the present invention.

In the photodetector illustrated in FIG. 6, the photo-absorption layer 8 is composed of germanium monocrystal, similarly to the first embodiment.

Since gallium arsenide is of crystal structure having the same lattice constant as that of germanium, it can be readily, epitaxially grown on a germanium layer. Hence, it is possible to grow the p-type gallium arsenide layer 13 on the p-type silicon layer 10 by the above-mentioned method suggested in Japanese Patent Application No. 9-70933. The photodetector in accordance with the second embodiment is fabricated in the same steps as those of the first embodiment except the step of growing the p-type gallium arsenide layer 13 on the p-type silicon layer 10.

The photodetector in accordance with the second embodiment has an improved high frequency characteristic relative to the photodetector in accordance with the first embodiment. In the first embodiment, if a light having a wavelength of 1.0 μm or greater was introduced into the photodetector, electric charges generated in the n- and p-type germanium layers 7 and 9 both of which are situated outside a depletion layer move to an end of the depletion layer by diffusion which gives electric charges a lower mobility than a mobility given by drift, resulting in deterioration of a frequency characteristic.

Gallium arsenide (GaAs) does scarcely absorb a light, if the light had a wavelength of 0.9 μm or greater. Hence, if a light was introduced downwardly into the photodetector, electric charges are scarcely generated in the p-type gallium arsenide layer 13 substituted for the p-type germanium layer 9. In addition, electric charges are not generated in the n-type germanium layer 7. Hence, if the germanium monocrystal layer 8 were designed to have a thickness enough to absorb a light thereinto, it would be possible to avoid deterioration in a high frequency characteristic caused by electric charges generated outside a depletion layer.

Figure 7A:
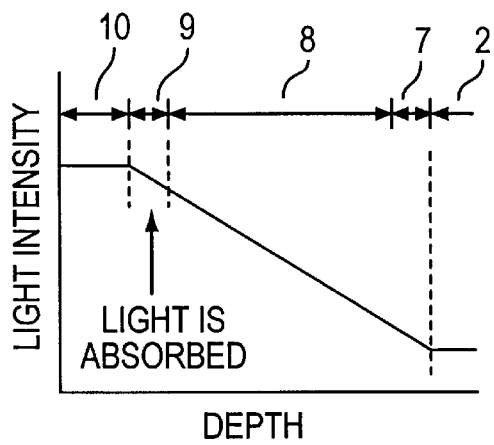
FIG. 7A is a graph showing optical attenuation of a light having a wavelength of 1 $\mu$m or greater in the photodetector in accordance with the first embodiment.
Figure 7B:
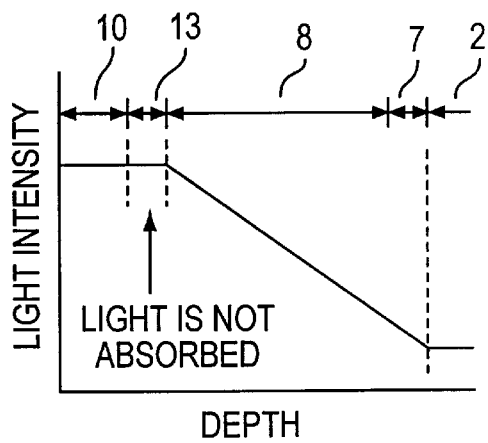
FIG. 7B is a graph showing optical attenuation of a light having a wavelength of 1 $\mu$m or greater in the photodetector in accordance with the second embodiment.

FIG. 7A illustrates photo-attenuation or photo-absorption to be observed when a light is introduced downwardly into the photodetector in accordance with the first embodiment, and FIG. 7B illustrates photo-attenuation or photo-absorption to be observed when a light is introduced downwardly into the photodetector in accordance with the second embodiment. In FIGS. 7A and 7B, each of the figures corresponds to each of the reference numerals indicating the structural elements constituting the photodetector in accordance with the first and second embodiments, illustrated in FIGS. 4 and 6, respectively.

As illustrated in FIG. 7A, a light begins to be absorbed first in the p-type germanium layer 9 in the first embodiment. That is, the light attenuation begins first at the p-type germanium layer 9.

On the other hand, as illustrated in FIG. 7B, a light is not attenuated at the p-type gallium arsenide layer 13 in the second embodiment. The light attenuation begins at the photo-absorption or germanium monocrystal layer 8. That is, the photodetector in accordance with the second embodiment could have an improved high frequency characteristic, if a light having a wavelength in a long wavelength band, namely, a wavelength of 1.0 μm or greater was introduced downwardly into the photodetector.

If the p-type germanium layer 9 was designed to be thin in the first embodiment, it does not matter whether the light attenuation begins at the p-type germanium layer 9. However, as mentioned earlier, the p-type germanium layer 9 is expected to become thick during growth thereof, because impurities diffuse rapidly in germanium. Hence, the above-mentioned advantage in the second embodiment can be expected to have in the first embodiment, too.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-97533 filed on Apr. 15, 1997 including specification, claims, drawings and summary is incorporated herein by reference in its entirety.

What is claimed is:

1. A semiconductor photodetector having a planar photo-absorptive layer, comprising:
   (a) a first semiconductor layer having a first conductivity and formed with a recess;
   (b) an insulating film covering a sidewall of said recess therewith;
   (c) a monocrystalline photo-absorption layer formed in said recess; and
   (d) a first layer sandwiched between said monocrystalline photo-absorption layer and said first semiconductor layer in said recess, said first layer preventing a depletion layer generated in said monocrystalline photo-absorption layer when a voltage is applied to said semiconductor photodetector, from reaching said first semiconductor layer.

2. The semiconductor photodetector as set forth in claim 1, wherein said first semiconductor layer is a silicon layer, and said insulating film is a silicon dioxide film.

3. A semiconductor photodetector having a planar photo-absorptive layer, comprising:
   (a) a first semiconductor layer having a first conductivity and formed with a recess;
   (b) an insulating film covering a sidewall of said recess therewith;
   (c) a monocrystalline photo-absorption layer formed in said recess;
   (d) a first layer sandwiched between said monocrystalline photo-absorption layer and said first semiconductor layer in said recess;
   (e) a second layer formed on said monocrystalline photo-absorption layer; and
   (f) a second semiconductor layer having a second conductivity and formed on said second layer, said first and second layers preventing a depletion layer generated in said monocrystalline photo-absorption layer when a voltage is applied to said semiconductor photodetector, from reaching said first and second semiconductor layers, respectively.

4. The semiconductor photodetector as set forth in claim 3, wherein said first and second semiconductor layers are silicon layers, and said insulating film is a silicon dioxide film.

5. A semiconductor photodetector having a planar structure, comprising:
   (a) a first semiconductor layer having a first conductivity and formed with a recess;
   (b) an insulating film covering a sidewall of said recess therewith;
   (c) a germanium monocrystal layer formed in said recess; and
   (d) a first layer sandwiched between said germanium monocrystal layer and said first semiconductor layer in said recess, said first layer preventing a depletion layer generated in said germanium monocrystal layer when a voltage is applied to said semiconductor photodetector, from reaching said first semiconductor layer.

6. The semiconductor photodetector as set forth in claim 5, wherein said first semiconductor layer is a silicon layer, and said insulating film is a silicon dioxide film.

7. The semiconductor photodetector as set forth in claim 5, wherein said first layer is a germanium layer.

8. The semiconductor photodetector as set forth in claim 5, wherein said first layer is a gallium arsenide layer.

9. The semiconductor photodetector as set forth in claim 5, wherein said first layer contains impurities at a concentration of about $1 \times 10^{18}$ cm$^3$.

10. A semiconductor photodetector having a planar structure, comprising:
    (a) a first semiconductor layer having a first conductivity and formed with a recess;
    (b) an insulating film covering a sidewall of said recess therewith;
    (c) a germanium monocrystal layer formed in said recess;
    (d) a first layer sandwiched between said germanium monocrystal layer and said first semiconductor layer in said recess;
    (e) a second layer formed on said germanium monocrystal layer; and
    (f) a second semiconductor layer having a second conductivity and formed on said second layer,
    said first and second layers preventing a depletion layer generated in said germanium monocrystal layer when a voltage is applied to said semiconductor photodetector, from reaching said first and second semiconductor layers, respectively.

11. The semiconductor photodetector as set forth in claim 10, wherein said first and second semiconductor layers are silicon layers, and said insulating film is a silicon dioxide film.

12. The semiconductor photodetector as set forth in claim 10, wherein said first layer is one of a germanium layer having a first conductivity and a germanium layer having a second conductivity, and said second layer is the other.

13. The semiconductor photodetector as set forth in claim 12, wherein said second layer is a germanium layer having said second conductivity, and said first semiconductor layer is a silicon layer, and said second semiconductor layer is a silicon layer having a second conductivity and formed on said second layer.

14. The semiconductor photodetector as set forth in claim 12, wherein said first and second layers contain impurities at a concentration of about $1 \times 10^{18}$ cm$^3$.

15. The semiconductor photodetector as set forth in claim 10, wherein said first and second layers contain impurities at a concentration of about $1 \times 10^{18}$ cm$^3$.

16. The semiconductor photodetector as set forth in claim 10, wherein said first layer is one of a germanium layer having a first conductivity and a gallium arsenide layer having a second conductivity, and said second layer is the other.

17. The semiconductor photodetector as set forth in claim 16, wherein said second layer is a gallium arsenide layer having a second conductivity, said first semiconductor layer is a silicon layer, and said second semiconductor layer is a silicon layer having a second conductivity and formed on said second layer.

18. The semiconductor photodetector as set forth in claim 16, wherein said first and second layers contain impurities at a concentration of about $1 \times 10^{18}$ cm$^3$.

* * * * *